(12) United States Patent
Fifield et al.

(10) Patent No.: US 10,192,590 B1
(45) Date of Patent: Jan. 29, 2019

(54) DIFFERENTIAL VOLTAGE GENERATOR

(71) Applicant: GLOBALFOUNDRIES INC., Grand Cayman (KY)

(72) Inventors: John A. Fifield, Underhill, VT (US); Eric Hunt-Schroeder, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/788,289

(22) Filed: Oct. 19, 2017

(51) Int. Cl.
  *G11C 5/14* (2006.01)
  *G05F 1/595* (2006.01)
  *G05F 1/10* (2006.01)
  *H03K 17/16* (2006.01)

(52) U.S. Cl.
  CPC ............... *G11C 5/147* (2013.01); *G05F 1/10* (2013.01); *G05F 1/595* (2013.01); *G11C 5/14* (2013.01); *H03K 17/164* (2013.01)

(58) Field of Classification Search
  CPC .. G11C 5/147; G11C 5/14; G05F 1/10; H03K 17/164
  See application file for complete search history.

(56) References Cited

U.S. PATENT DOCUMENTS

| | | | |
|---|---|---|---|
| 6,509,858 B2 | 1/2003 | Karanicolas | |
| 7,307,447 B2 * | 12/2007 | Clements | H04L 25/028 326/27 |
| 8,390,264 B2 | 3/2013 | Lin | |
| 8,773,920 B2 | 7/2014 | Anand et al. | |
| 8,848,426 B2 | 9/2014 | Azuma et al. | |
| 9,000,837 B1 | 4/2015 | Fifield | |
| 9,046,909 B2 * | 6/2015 | Leibowitz | G05F 1/462 |
| 9,275,749 B1 | 3/2016 | Ogawa | |
| 9,684,321 B2 * | 6/2017 | Leibowitz | G05F 1/462 |
| 2009/0039842 A1 * | 2/2009 | Chen | H02M 3/1584 323/272 |
| 2010/0001704 A1 * | 1/2010 | Williams | H02M 3/157 323/283 |

* cited by examiner

*Primary Examiner* — Vanthu T Nguyen

(74) *Attorney, Agent, or Firm* — Gibb & Riley, LLC; Michael J. LeStrange, Esq.

(57) ABSTRACT

Differential voltage generators receive an initial target voltage, and provide the initial target voltage to a first offset element and a second offset element. The first offset element includes first transistors, and the second offset element includes second transistors. Each of the first transistors is capable of changing the initial target voltage by a different incremental amount to change the initial target voltage to an altered target voltage. The second transistors are capable of removing a current generated by the first transistors, thereby causing an opposite current and leaving the initial target voltage unaffected on a second output. Each of the first transistors has a corresponding second transistor that produces the same current. A first output is capable of outputting the altered target voltage, and the second output is capable of outputting the initial target voltage.

20 Claims, 5 Drawing Sheets

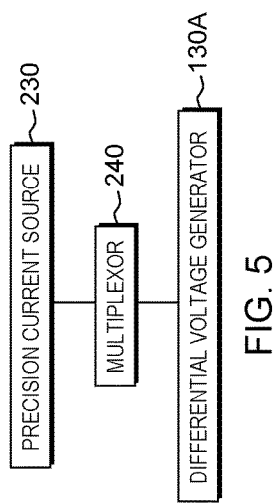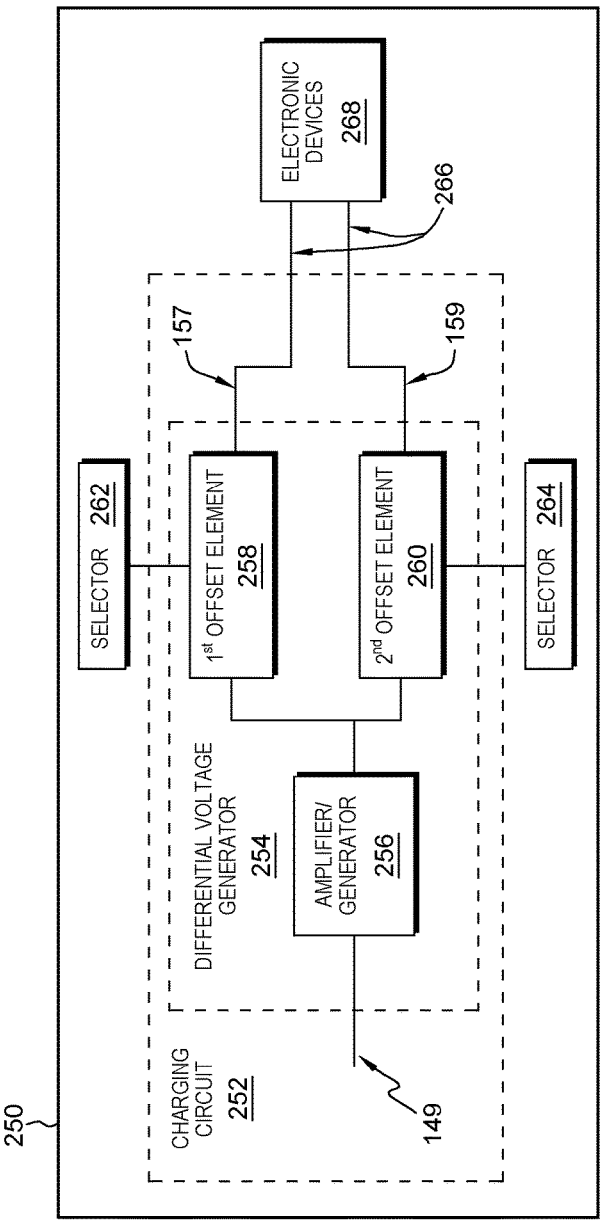

DIFFERENTIAL VOLTAGE GENERATOR

BACKGROUND

Field of the Invention

The present disclosure relates to charging circuits, and more specifically, to charging circuits that use differential voltage generators.

Description of Related Art

U.S. Pat. No. 9,000,837 to Fifield is partially incorporated herein and explains details of one type of dynamic random access memory (DRAM) device. More specifically, FIG. 1 (incorporated from U.S. Pat. No. 9,000,837) shows a block diagram of an exemplary DRAM 100 that may include configuration logic 105, an adjustable voltage generator 110, a single-ended sense device 120, a memory cell array 125, a voltage buffer 130, and a voltage regulator 135. The configuration logic 105 controls the adjustable voltage generator 110 to produce a target voltage 149. This voltage is used to generate a bit line restore voltage 150 that pre-charges a global bit line 151 (i.e., "GBL") to a level that is the same as a switch-point voltage of the single-ended sense device 120. That is, the voltage buffer 130 receives the target voltage 149 produced by the adjustable voltage generator 110 and outputs a high target voltage 157 (i.e., H Target V) and low target voltage 159 (i.e., L Target V). The high target voltage 157 is equal to the target voltage 149 and the low target voltage 159 at an offset below the high target voltage 157 by a predetermined amount (e.g., 20 mV less). The voltage regulator 135 receives the high target voltage 157 and the low target voltage 159, and uses them to generate the bit line restore voltage 150, which is at the midpoint of the high target voltage 157 and the low target voltage 159.

The sense device 120 is a single-ended sense device that has a single data input connected to the global bit line 151, which links the sense device 120 to the memory cell array 125. The sense device 120 can be, for example, an amplifier, an inverter, a comparator, or the like that outputs either a low or a high e.g., "0" or a "1" digital logic. As is conventional, the sense device 120 switches between "0" and a "1" when the voltage of the global bit line 151 is below or above a switch-point voltage (e.g., 0.5V) of the sense device 120.

The memory cell array 125 includes a plurality of memory cells 112 tied to a common local bit line 152 (i.e., "LBL") and an isolator 114. The memory cells 112 can be eDRAM memory cells that are embedded on a single semiconductor die. It should be noted that FIG. 1 shows three memory cells 112 for the sake of example. However, DRAM arrays can include a greater number of memory cells 112. For example, the memory cells 112 can be arranged along 64 word lines, wherein groups of the 64 bit-cells of the memory cell array 125 are connected to corresponding sense devices 120 via respective local bitlines.

The isolator 114 is a device (e.g., a complementary metal oxide semiconductor (CMOS) switch) that disconnects the local bit line 152 from the global bit line 151 when, for example, none of the memory cells 112 in memory cell array 125 are being read. Before information is read from the memory cell array 125, the isolator 114 disconnects the local bit line 152 from the global bit line 151, and the global bit line 151 is pre-charged to the bit line restore voltage 150, (which is based on the target voltage 149 output by the adjustable voltage generator 110). When a value stored in one of the memory cells 112 is read, the memory cell array 125 controls the isolator 114 to connect the local bit line 152 to the global bit line 151. In addition, the memory cell array 125 connects a selected one of the memory cells 112 to the local bit line 152. After information is read from the memory cell array 125, the global bit line 151 is restored to a voltage that centers the "high" and "low" data levels of the memory cells 112 on either side of the switch-point voltage of the sense device 120 by the bit line restore voltage 150.

The bit line restore voltage 150 is set based on the configuration logic 105, such that when isolator 114 is conducting, the charge on the local bit line 152 combined with the charge on the global bit line 151 will develop a voltage which is the same as a switch-point voltage of the sense device 120. For example, where the switch point of the single-ended switch device is 0.5V, the bit line restore voltage 150 is selected such that the band of "high" state voltages and the band of "low" state voltage are centered around 0.5V.

Accordingly, the adjustable voltage generator 110 can be set by the configuration logic 105 to output a target voltage 149 such that the bit line restore voltage 150 is set to a voltage level that, when charge stored on the global bit line 151 is shared with the charge stored on the local bit line 152, the voltage on the global bit line 151 resulting from their combination is at the switch-point voltage of the sense device 120 (e.g., 0.5V). When one of the memory cells 112 is read, the voltage developed on the respective local bit line 152 pulls the pre-charged voltage of the global bit line (e.g., 0.5V) lower or higher. The sense device 120 outputs a logic low or logic high value (e.g., "0" or "1") corresponding to the change in the voltage of the global bit line 151 due to the voltage read from one of the memory cells 112. However, the switch-point voltage of single-ended sense devices may vary from device-to-device due to manufacturing process variations and/or environmental conditions. Thus, for example, the switch-point voltage of the sense device 120 may be 0.45 V. In such case, if the bit line restore voltage 150 is set to result in a 0.5 V precharge level, a "low" voltage stored in one of the memory cells 112 may fail to pull the voltage of the global bit line 151 below 0.45 V. In such a situation, the stored value of the memory cell 112 would not be interpreted as "low," but instead would be misinterpreted as being "high." Thus, the adjustable voltage generator 110 is controlled to selectively increase or decrease the bit line restore voltage 150 to center the "high" and "low" data bands on the switch-point voltage of the sense device 120 (e.g., 0.45 V) based on the results of electrical testing of a physical device (rather than approximating it using modeling and simulation).

The bit line restore voltage 150 can be set during initial, post-production configuring of the DRAM 100 to tune the bit line restore voltage 150 to center the expected data bands at the switch-point voltage of sense device 120. Additionally or alternatively, the bit line restore voltage 150 can be set after installation of the DRAM 100 in a system to center the data bands at the switch-point voltage of the sense device 120 based on operating conditions of the system (e.g., temperature, etc.). The voltage level of the bit line restore voltage 150 is determined by signal margin testing of the memory cell array 125. For example, a power supply voltage can be adjusted to its minimum and/or maximum value and the operating temperature can be raised, and/or lowered to its upper and lower values creating a matrix of tests. The voltage value of the bit line restore voltage 150 can be adjusted through a range as each of the memory cells is tested for correct retention of "1" and "0" data types. Pass/fail maps can be made by overlapping a number of tests and the bit line restore voltage 150 can be centered at a point giving test margin to all tests.

Still referring to FIG. 1, the configuration logic 105 may be one or more devices that control the adjustable voltage generator 110 to adjust the bit line restore voltage 150. The configuration logic 105 is connected to the adjustable voltage generator 110 and provides it with several signals including an enable signal 161 (i.e., EN), a mode select signal 162, and a control word signal 163. The enable signal 161 is one or more signals that selectively enables/disables the adjustable voltage generator 110 when, for example, its function is not necessary (e.g., during a test mode). The mode select signal 162 controls the adjustable voltage generator 110 to switch between a first mode, in which the target voltage 149 is decreased, and a second mode, in which the target voltage 149 is increased. The control word signal 163 selectively controls the offset of the target voltage 149 from a bit line source voltage 160 (e.g., ±0.25 mV, ±0.50 mV, ±0.75 mV, . . . ±5.0 mV). The control word signal 163 can be a digital signal (e.g., a 4-bit digital logic word) whose value controls the output of the adjustable voltage generator 110 based on the control word signal 163. As shown in FIG. 1, the configuration logic 105 resides in the DRAM 100. However, some or all of the elements of the configuration logic 105 can be elsewhere. For example, a system (e.g., computing device or test bench) in which the DRAM 100 is installed may incorporate some are all of the configuration logic 105.

Configuration logic 105 includes a non-volatile data storage device 170 (e.g., a fusible memory device) that stores values for the mode select signal 162 and a control word signal 163. For example, based on the switch-point voltage of the singled-ended sense device 120 determined from post-manufacturing electrical testing of the DRAM 100, an individual (e.g., a test and evaluation engineer) or an automated program can store values for the enable signal 161, the mode select signal 162 and/or control word signal 163 in the storage device 170 of the configuration logic 105 to control the bit line restore voltage 150. Additionally or alternatively, based on the switch-point voltage determined from monitoring operational conditions (e.g., temperature) of the DRAM during operation in a fielded system, an individual or an automated program can change the values for the enable signal 161, the mode select signal 162 and/or control word signal 163 in the storage device 170.

The adjustable voltage generator 110 is a device or a combination of devices that outputs the target voltage 149, which is higher or lower than the bit line source voltage 160. Based on the mode select signal 162 and the control word signal 163, the adjustable voltage generator 110 can increase and decrease the bit line source voltage 160 to produce the target voltage 149. The bit line source voltage 160 can be provided to the adjustable voltage generator 110 from a bandgap reference voltage source.

With continued reference to FIG. 1, the adjustable voltage generator can include a voltage controller 180, a voltage adjuster 182, a switch 184, and a current source 186. The voltage controller 180 includes one or more devices that control the operation of the voltage adjustor 182 to keep it in an optimal operating range under different current draws by the current source 186 based on the enable signal 164 and the content of the control word signal 163. The voltage controller 180 selectively controls the voltage adjustor 182 to improve the linearity of the target voltage 149 output by the adjustable voltage generator 110 under different operating conditions. For example, when current source 186 draws a large amount of current in order to increase the target voltage 149, the voltage controller 180 can selectively configure the voltage adjuster 182 such that analog elements (e.g., an amplifier and output transistors) operate linearly.

The voltage adjuster 182 is one or more devices that generate the target voltage 149 at a level that is above or below the level of the bit line source voltage 160. The target voltage 149 is then used by the voltage buffer 130 and the voltage regulator 135 to generate the bit line restore voltage 150, which pre-charges the global bit line 151 to a level that will center the band of "high" and "low" data levels to the switch-point voltage of the single-ended sense device 120. The voltage adjuster 182 includes a first circuit path 165 (i.e., "circuit path 1") and a second circuit path 167 (i.e., "circuit path 2") that, when selected by the switch 184, control the voltage adjuster 182 to respectively decrease or increase the target voltage 149.

The switch 184 is one or more devices that alternately select one of two states based on the mode select signal 162. In the first state (i.e., "Decrease Target V"), the switch 184 connects the first circuit path 165 of the voltage adjuster 182 to the current source 186 such that current drawn by the current source 186 decreases the target voltage 149 output by the voltage adjuster 182. In the second state (i.e., "Increase Target V"), the switch 184 connects the second circuit path 167 of the voltage adjuster 182 to the current source 186 such that current drawn by the current source 186 increases the target voltage 149 output by the voltage adjuster 182.

The current source 186 includes one or more devices that incrementally adjust the value of the target voltage 149 based on the control word signal 163. That is, the information included in the control word signal 163 selectively controls the amount of current drawn by the current source 186 from the voltage adjuster 182. The control word signal 163 selects one of a predetermined number of current levels provided by the current source 186. For example, the current source 186 may include a number of different current paths that can be progressively activated to provide incremental increases in current flow from the voltage adjuster 182 via either the first circuit path 165 or the second circuit path 167.

The voltage buffer 130 and the voltage regulator 135 use the target voltage 149 to generate the bit line restore voltage 150. The voltage buffer 130 receives the target voltage 149 to isolate the adjustable voltage generator 110 from the voltage regulator 135. The voltage buffer 130 outputs the high target voltage 157 and the low target voltage 159. The high target voltage 157 and the low target voltage 159 provide upper and lower limit reference voltages to the voltage regulator 135, which generates the bit line restore voltage 150. That is, the voltage regulator 135 keeps the bit line restore voltage 150 within a regulated range (e.g., 20 mV). As the high target voltage 157 and the low target voltage 159 are adjusted above and below the bit line source voltage 160, the voltage regulator 135 provides the bit line restore voltage 150, which can be adjusted to increase the sense margin of a "1" over a "0" logic or vice versa.

The components of the DRAM 100, including the configuration logic 105, the adjustable voltage generator 110, the single ended sense device 120, the memory cell array 125, the voltage buffer 130, the voltage regulator 135, and their respective components, are shown in FIG. 1 as discrete units. It will be understood that this depiction is a functional representation for the sake of example. Embodiments of the DRAM 100 are not limited to the divisions depicted in FIG. 1, and the components can be organized differently. For example, the adjustable voltage generator 110, the voltage buffer 130, and/or the voltage regulator 135 can be combined into a single unit. Further, the voltage controller 180, voltage adjuster 182, the switch 184, and/or the current source 186 can be divided from the adjustable voltage generator 110 into separate units, for example. Further, as noted above, the configuration logic 105 need not be included in the DRAM 100 and, instead, can be part of a system in which the DRAM 100 is installed.

SUMMARY

Various integrated circuit devices herein include (among other components) electronic lines (e.g., wordlines, bitlines, etc.) connected to electronic memory cells, a charging circuit that is connected to the electronic lines and that is capable of charging the electronic lines, etc. In one example, the charging circuit includes a differential voltage generator.

Such a differential voltage generator includes (among other components) a voltage input, a first offset element (e.g., a digital-to-analog converter) and a second offset element (of opposing transistors) connected to the voltage input, a multiplexor connected to the first offset element and the second offset element, a first output connected to the first offset element, a second output connected to the second offset element and to the voltage input, etc.

The voltage input is capable of receiving an initial target voltage and providing the initial target voltage to the first offset element and the second offset element. A unity gain operational amplifier is connected to the voltage input, the unity gain operational amplifier is capable of supplying the initial target voltage to the second output. The first offset element includes first transistors and the second offset element includes corresponding second transistors. The multiplexor is capable of selecting pairs of the first transistors and the second transistors that generate the same, but opposite, current.

Each of the first transistors is capable of changing (e.g., pulling-up) the initial target voltage by a different incremental amount to change the initial target voltage to an altered target voltage (e.g., VREADH). More specifically, the first transistors increment the initial target voltage in equal voltage increments from a low voltage target (e.g., VREADL) to a high voltage target (e.g., VREADH) when the first transistors change the initial target voltage to the altered target voltage.

A current is generated by the first transistors when the first transistors change the initial target voltage to the altered target voltage. The second transistors are capable of removing the current flow generated by the first transistors by causing opposite current, to leave the initial target voltage unaffected on the second output. Each of the first transistors has a corresponding pair transistor in the second transistors that causes the same current flow. More specifically, a resistor can be connected between the first offset element and the second offset element, and the current generated by the first transistors is removed from the resistor by the matching, but opposing, current generated by the second transistors. In other words, the pairs of the first transistors and the second transistors cause an equal and opposite current through the resistor to prevent voltage changes caused by the first transistors from affecting the initial target voltage on the second output.

Additionally, a precision current source can be connected to the multiplexor. Such a precision current source is capable of providing selection signals to the multiplexor to select the pairs of the first transistors and the second transistors that generate the same current. The first output is capable of outputting the altered target voltage, and the second output is capable of outputting the initial target voltage.

Various methods herein perform operations including, but not limited to receiving an initial target voltage using the voltage input of the differential voltage generator. The initial target voltage is supplied to the second output using the unity gain operational amplifier. These methods also provide the initial target voltage to the first offset element and the second offset element of the differential voltage generator. As noted above, the first offset element includes first transistors, and the second offset element includes second transistors.

With these methods, the multiplexor of the differential voltage generator, selects pairs of first and second transistors that generate the same current. This involves the precision current source of the differential voltage generator providing selection signals to the multiplexor to select the pairs of first and second transistors that generate the same current. Such methods can then change the initial target voltage by a different incremental amount to change the initial target voltage to an altered target voltage (using the selected first transistors). More specifically, these methods use the selected first transistors to increment the initial target voltage in equal voltage increments from the low voltage target to the high voltage target, when the first transistors change the initial target voltage to the altered target voltage.

Further, these methods remove the current generated by the first transistors (using corresponding ones of the second transistors), thereby causing an opposite current, and leaving the initial target voltage unaffected. Again, each first transistor has a corresponding second transistor that produces the same current as the first transistor to which it corresponds. More specifically, the current generated by the first transistors is removed from a resistor of the differential voltage generator by the opposing current generated by the second transistors. Thus, the second transistors generate an equal and opposite current through the resistor to prevent voltage changes caused by the first transistors from affecting the initial target voltage. These methods then output the altered target voltage from the first output, and output the initial target voltage from the second output.

BRIEF DESCRIPTION OF THE DRAWINGS

The embodiments herein will be better understood from the following detailed description with reference to the drawings, which are not necessarily drawn to scale and in which:

FIG. 5 is a schematic diagram illustrating an electronic device according to embodiments herein;

FIG. 6 is a schematic diagram illustrating an electronic device according to embodiments herein.

DETAILED DESCRIPTION

As mentioned above, conventional systems use differential voltage generators. Such systems that use a unity gain amplifier with an operational amplifier to buffer an input-voltage reference draw a fixed offset current through an offset resistor to ground; however, input-offset error is increased if the offset current is varied, because the gate voltage of the output transistor varies from its ideal operating point (near the voltage of the complementary operational amplifier node), and drain modulation reduces the gain and increases error. Additionally the operating range of such systems is limited by the cutoff of the output transistor, as offset-current is increased at higher differential voltage settings. The structures disclosed herein address this situation by applying equal and opposite currents to such an offset resistor. This allows the gate voltage of the output to not be disturbed by current passing thru the offset resistor, avoiding the offset current variation issues that occur with systems that draw a fixed offset current.

Figure 1:
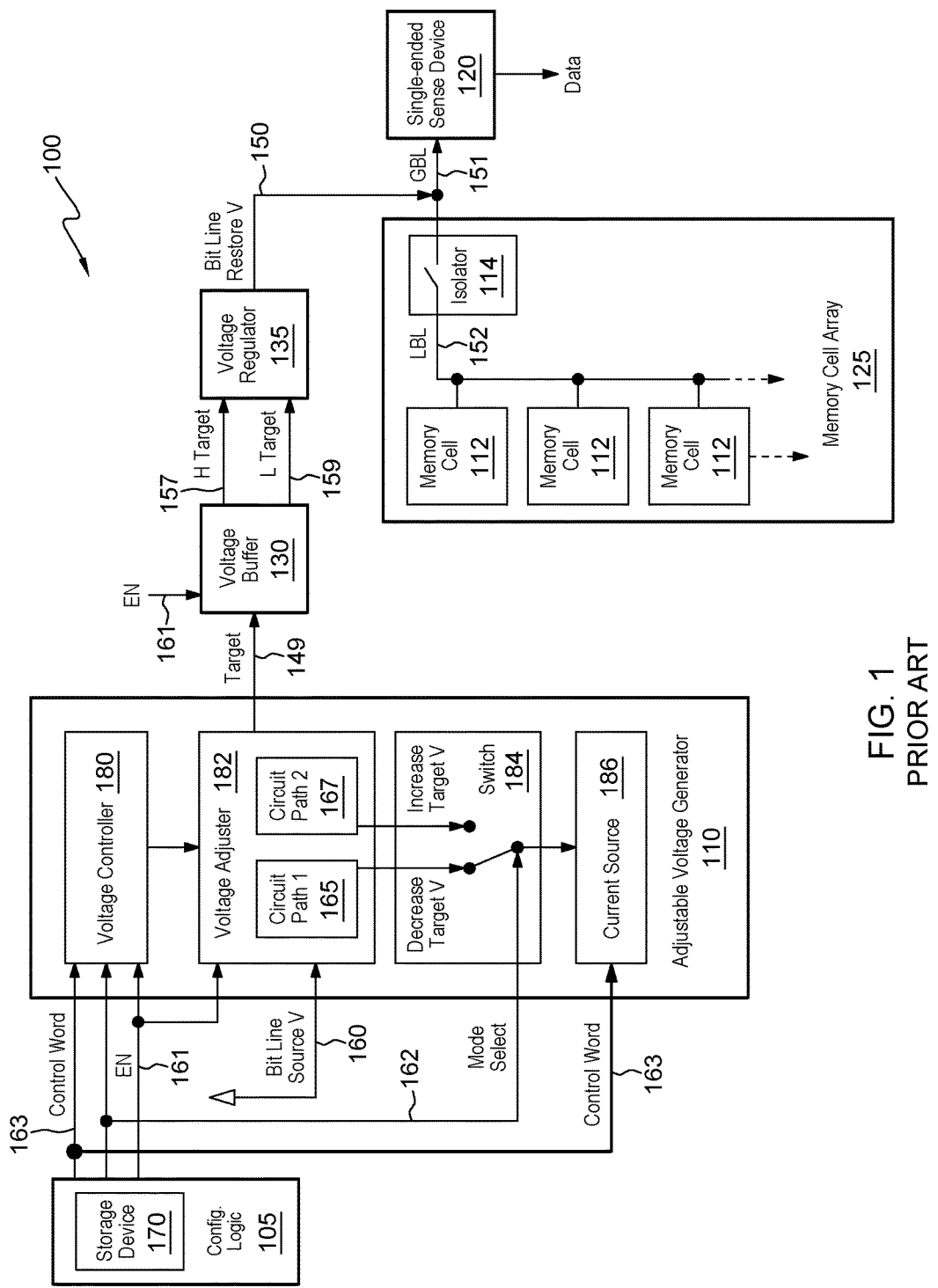
FIG. 1 is a schematic diagram illustrating a prior art DRAM structure.
Figure 2:
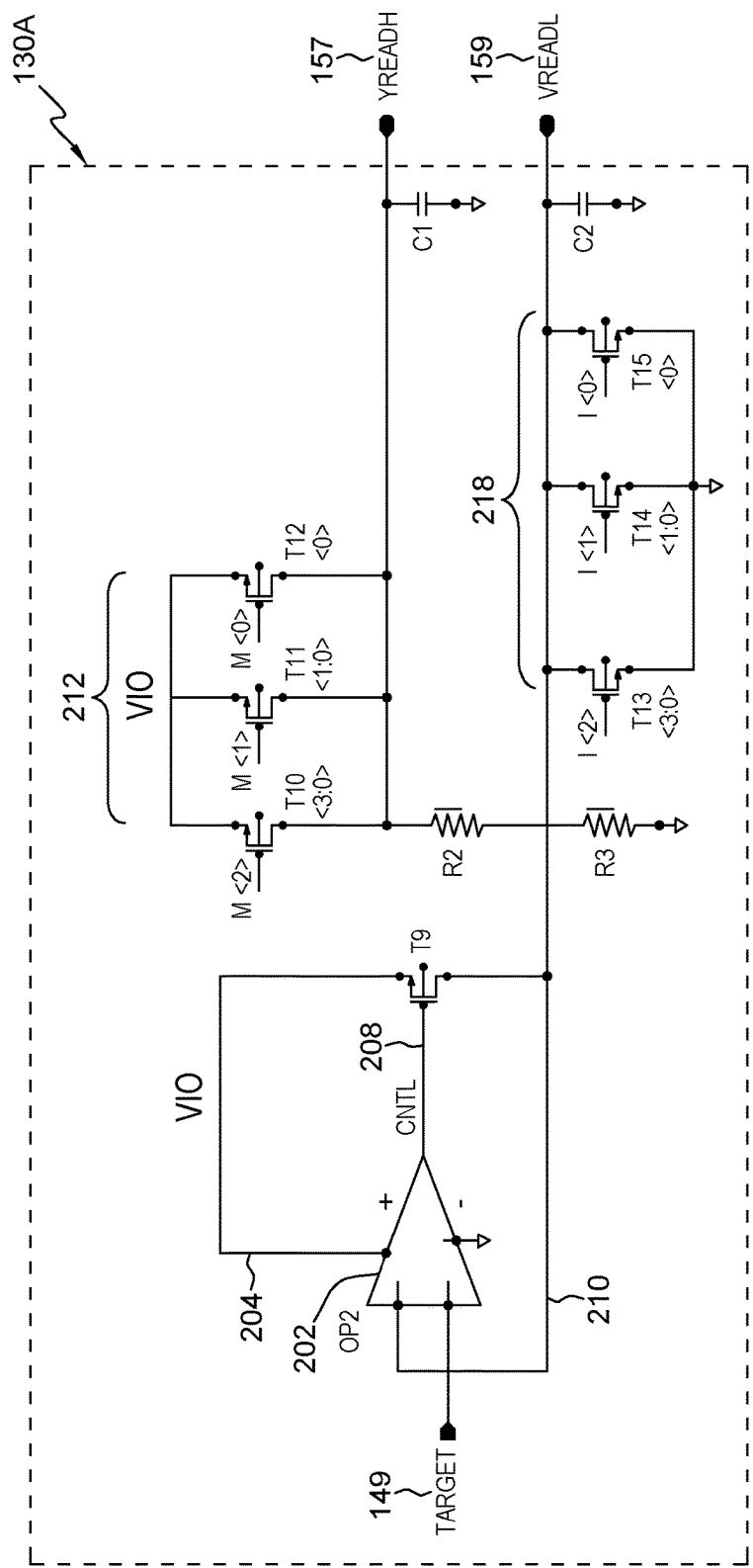
FIG. 2 is a schematic diagram illustrating a differential voltage generator according to embodiments herein.

FIG. 2 illustrates one exemplary differential voltage generator/voltage buffer 130A in accordance with aspects herein. The differential voltage generator 130A may be used where the voltage buffer 130 is shown used in FIG. 1, discussed above, or within other circuits that use similar devices (such as a generic device, shown in FIG. 6, discussed below). As noted previously, the voltage buffer 130A in a DRAM device can receive a target voltage 149 as an input, and outputs a high target voltage (which is referred to in FIG. 2 as a voltage read high (VREADH) output 157) and a low target voltage (which is referred to in FIG. 2 as a voltage read low (VREADL) output 159).

FIG. 2 illustrates a unity gain operational amplifier 202 that receives the target voltage 149 as a reference, operates using power (VIO), and outputs a control signal (CNTL) 208 to output transistor T9. Additionally, the voltage across output resistor T9 is returned by a feedback loop 210 as input to the operational amplifier 202 to provide unity gain.

A multi-transistor voltage pull-up device 212 is used to pull the voltage signal (CNTL) output from the operational amplifier 202 (and transistor T9) to a higher voltage (VREADH) and the same is provided on output 157. Additionally, FIG. 2 illustrates NFET current source transistors 218 (T13, T14 and T15) connected to the VREADL output 159. The different transistors T10-T12 of the multi-transistor voltage pull-up device 212 each pull up the CNTL signal (increase the CNTL signal's voltage) by an additional (and possibly different) voltage amount. Therefore, activation of one or more of transistors T10-T12 can pull the voltage of the CNTL signal up by different increments. In one example, three transistors can be used to increase the voltage of the CNTL signal in increments of 5 mv (from 5 mv to 35 mv).

Therefore, in one non-limiting example of how the concepts herein could be implemented, the multi-transistor voltage pull-up device 212 could be a 3-bit digital-to-analog (DAC) circuit 212 connected to the offset resistor R2 and the VREADH output 157. The DAC circuit 212 includes P-type field effect transistors (PFETs) T10, T11 and T12 that are sized to generate different offsets of 20 mv, 10 mv and 5 mv, respectively, (when enabled by multiplexor MUX1 242, shown in FIG. 4, as discussed below).

Figure 3:
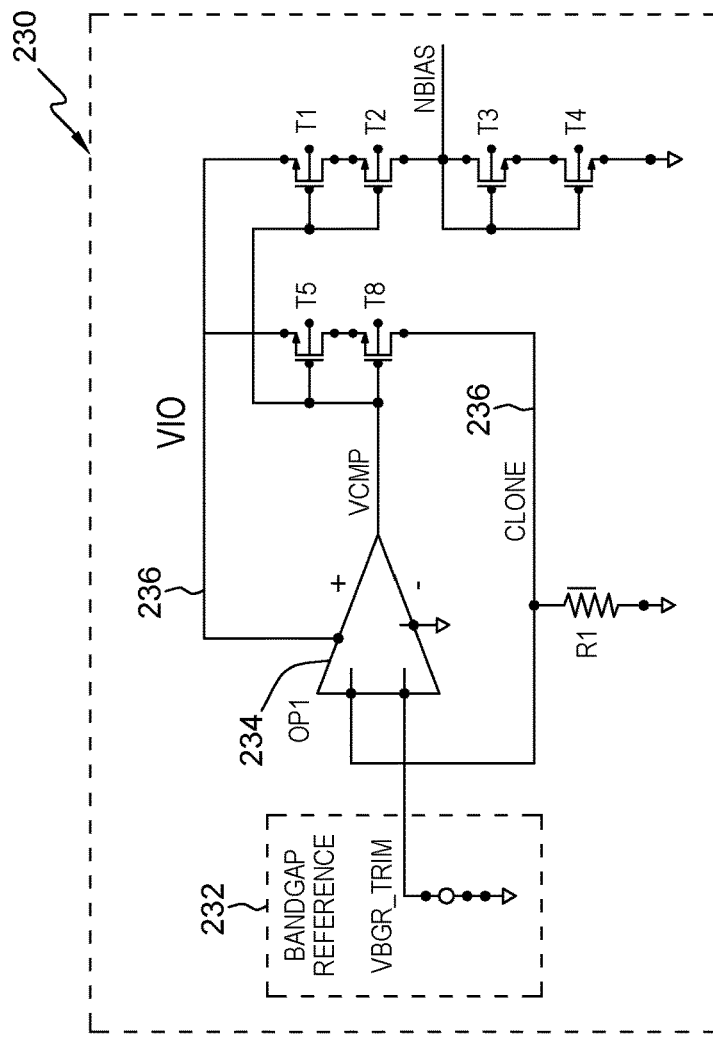
FIG. 3 is a schematic diagram illustrating a precision current source according to embodiments herein.

FIG. 3 illustrates a precision current source 230 connected to the voltage buffer 130A. The precision current source 230 uses a bandgap reference generator 232 that provides a constant bandgap voltage (VBGR_TRIM) to a unity gain operational amplifier 234 that is powered by voltage VIO. A feedback loop 236 returns the VCMP output as a clone signal to the input of the operational amplifier 234, providing unity gain. VCMP will be the gate voltage required on PFET in order for the CLONE voltage to be the same as VBGR_TRIM in the unity gain operational amplifier 234. The operational amplifier 234 outputs a gate bias voltage VCMP (which is the same as CLONE) to transistors T5, T6, which mirror the current to transistors T1, T2 (when saturated). Output from the precision current source 230 (NBIAS) is generated from the VCMP by T3 and T4, in the same manner, by reflecting the same, but relatively negative (opposite), current. This current reference (NBIAS) produced using a current mirror technique is more accurate than simply using a current reference from the bandgap circuit 232 itself.

Figure 4:
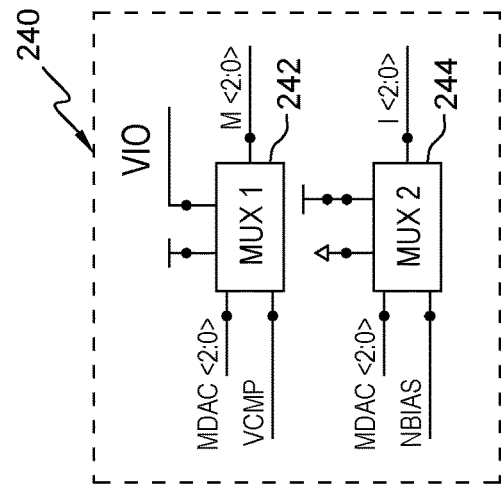
FIG. 4 is a schematic diagram illustrating a multiplexor according to embodiments herein.

Additionally, FIG. 4 illustrates multiplexors 240 that include multiplexor MUX1 242 and multiplexor MUX2 244. Multiplexor MUX1 242 uses the PFET current source gate bias voltage VCMP (from the precision current source 230) and the digital word MDAC<2:0> as input for enabling specific transistors of the DAC circuit 212 shown in FIG. 2 (where MDAC<2:0> indicates that the MDAC signal, provided manually or automatically, can be 0, 1, and/or 2). Note that in FIG. 4, output from MUX1 242 is referenced using the symbol "M," where M<2:0> indicates that M can be 0, 1, and/or 2; and as shown in FIG. 2: M<2> activates transistor T10, M<1> activates transistor T11, and M<0> activates transistor T12.

Multiplexor MUX2 244 uses the NFET current mirror voltage NBIAS (from the precision current source 230) and MDAC<2:0> as input for enabling the NFET current source transistors 218 shown in FIG. 2. Note that in FIG. 4, output from MUX2 244 is referenced using the symbol "I," where k2:0> indicates that I can be 0, 1, and/or 2; and as shown in FIG. 2: I<2> activates transistor T13, I<1> activates transistor T14, and I<0> activates transistor T15.

Note that FIG. 5 illustrates one example of a structure that can include the precision current source 230 controlling selection of the multiplexor 240, which in turn selects the pairs of transistors in the differential voltage generator 130A. Referring to the combined operation of the voltage buffer 130A in FIG. 2, the precision current source 230 in FIG. 3, and the multiplexors in FIG. 4; during operations, a specific pull-up current is supplied to offset resistor R2, as controlled by which transistors the multiplexor 242 activates in the DAC circuit 212, and this pulls the VREADH output 157 up by the voltage increment of the activated/selected transistor(s). More specifically, the DAC circuit 212 turns on one or more of the transistors T10, T11, or T12 based on the M<2:0> signal from the multiplexor MUX1 242 (as shown in FIG. 4) to activate transistors T10, T11, and/or T12. Because T10, T11, and T12 in the DAC circuit 212 are sized to generate an offset of 20 mv, 10 mv and 5 mv respectively in this example, when enabled by multiplexor MUX1 242, this allows precise control in 5 mv increments over a 5 mv to 35 mv difference between output voltages VREADL 159 and VREADH 157.

Additionally, equal and opposite currents are drawn out of the offset resistor R2 by NFET current sources 218 (T13, T14, or T15) to exactly cancel the current flowing into offset resistor R2 from the DAC circuit 212 (T10, T11, or T12). More specifically, multiplexor MUX2 244 uses the k2:0> signal from the MUX2 244 to activate one or more of the complementary pull-down NFETs (T13, T14, or T15) to match the enabled pull-up PFET (T10, T11, or T12).

This removal of current from the offset resistor R2 allows the gate voltage of output PFET T9 to not be disturbed by DAC 212 current passing thru the offset resistor R2. Therefore, the gate voltage CNTL 208 is essentially constant over the DAC 212 range, which again can provide, for example, a 5 mv to 35 mv incremental difference between output voltages VREADL 159 and VREADH 157. Hence, the operating point of output PFET T9 can be maintained in a preferred region independently of the setting of the DAC circuit 212 that is used to set the voltage difference between VREADL 159 and VREADH 157. Further, this allows the level of the CNTL signal 208 to be largely invariant over the entire DAC range of 5 mv to 35 mv, and the CNTL signal 208 stays at a preferred voltage level.

To the contrary, systems (such as those discussed in the Background section above) that use a unity gain amplifier with an operational amplifier and an output FET to buffer an input-voltage reference, draw a fixed offset current through a resistor to ground. Because of this, the input-offset error is increased if the offset current is varied (because the gate voltage of the output transistor (e.g., corresponding to output transistor T9 above) would vary from its ideal operating point near the voltage of the complementary operational amplifier node); and further, drain modulation would reduce the gain and increase the error. Additionally, the operating range of such systems would be limited by the cutoff of the output transistor, as offset-current is increased at higher differential voltage settings. The structures of embodiments herein address this situation because the equal and opposite currents produced by elements 212 and 218 remove any and all current from resistor R2. This allows the gate voltage of output PFET T9 to not be disturbed by DAC 212 current passing thru the offset resistor R2, avoiding the offset current variation issues that occur with systems that draw a fixed offset current.

Therefore, as shown in FIG. 6, various integrated circuit devices 250 herein include (among other components) electronic lines 266 (e.g., bitlines, wordlines, etc.) connected to any form of electronic devices 268 (e.g., electronic memory cells, memory devices, capacitors, control devices, etc.) that are capable of using a voltage charge, precharge, recharge, etc. Additionally, as also shown in FIG. 6, a charging circuit 252, such as a pre-charging circuit, charge trap circuit, voltage generator/buffer/regulator circuit, etc., (that is connected to the electronic lines 266) is capable of charging the electronic lines 266, etc. In one example, the charging circuit includes a differential voltage generator 254.

As also shown in FIG. 6, such a differential voltage generator 254 includes (among other components) a voltage/signal input 149 connected to any form of amplifier or signal generator 256. While operational amplifiers 202 are used in some examples herein, the amplifier/signal generator 256 shown in FIG. 6 is any form of device that is capable of providing an output that is based on the initial target voltage supplied to voltage/signal input 149, and this output from the amplifier/signal generator 256 can be an unaffected, voltage increased, voltage decreased, frequency filtered, frequency shifted, etc., version of the signal or voltage supplied to the input 149 (depending upon application).

The differential voltage generator 254 also includes a first offset element 258 and a second offset element 260 connected to the voltage/signal input 149 through the amplifier/signal generator 256. Therefore, the input 149 is capable of receiving the initial target voltage and providing the initial target voltage to the first offset element 258 and the second offset element 260 through the amplifier 256. Also, one or more selectors 262, 264 (which can be multiplexors, as discussed above, or any other device capable of selecting, activating, switching, choosing, etc., active devices) are connected to the first offset element 258 and the second offset element 260. Devices which are not illustrated in FIG. 6 can automatically (or in response to manual input) provide signals to the selectors 262, 264 to cause or allow the selectors 262, 264 to be capable of activating specific ones of the active devices in the first and second offset elements 258, 260.

While a 3-bit DAC 212 is used in examples herein, the first offset element 258 can be any device having any number of active elements (such as transistors, diodes, switches, etc.) that are capable (alone or in combination) of increasing or decreasing the voltage of a signal provided. Thus, for example, each of the active elements is capable of changing (e.g., pulling-up) the initial target voltage by a different incremental amount, to change the initial target voltage to an altered target voltage. More specifically, the active elements can increment the initial target voltage in equal voltage increments from a low voltage target to a high voltage target, when the active elements change the initial target voltage to the altered target voltage.

Further, the second offset element 260 can be any device that has the same number of corresponding active elements that are of opposite polarity to those of the first offset element 258, and that are capable of providing, generating, causing, drawing, etc., the same amount of current that the first offset element 258 provides, generates, causes, draws; but in an opposite direction relative to ground, opposite polarity, opposite current flow direction, etc.

The differential voltage generator 254 again includes the first output 157 connected to the first offset element 258, and a second output 159 connected to the second offset element 218 and to the initial target voltage input 149 through the amplifier/generator 256. The first and second outputs 157, 159 again output relatively different voltage versions of the signal supplied to the input 149.

As noted above, a current is generated by the first offset element 258 when the first offset element 258 changes the initial target voltage to the altered target voltage. The second offset element 260 is capable of removing the current flow generated by the first offset element 258 by causing opposite current, to leave the initial target voltage unaffected on the second output 159. The first offset element 258 has a corresponding pair device in the second offset element 260 that causes the same, but opposite, current flow. More specifically, the current generated by the first offset element 258 is removed by the matching, but opposing, current generated by the second offset element 260. In other words, the corresponding selected pairs of components of the first offset element 258 and the second offset element 260 cause an equal and opposite current, to prevent voltage changes caused by the first offset element 258 from affecting the initial target voltage on the second output 159.

Figure 7:
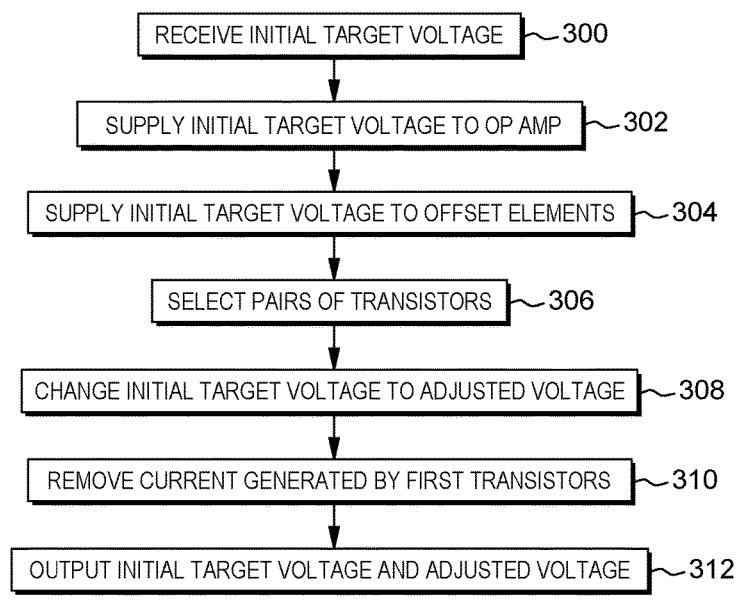
FIG. 7 is a flow diagram illustrating embodiments herein.

FIG. 7 is a flowchart illustrating operations performed by embodiments herein. More specifically, methods herein perform operations including, but not limited to receiving an initial target voltage in item 300 using the voltage input of the differential voltage generator. The initial target voltage is supplied to the second output using the unity gain operational amplifier in item 302. These methods also provide the initial target voltage from the unity gain operational amplifier to the first offset element and the second offset element of the differential voltage generator in item 304. As noted above, the first offset element includes first transistors, and the second offset element includes second transistors.

With these methods, the multiplexor of the differential voltage generator, selects pairs of first and second transistors that generate the same current in item 306. This involves the precision current source of the differential voltage generator providing selection signals to the multiplexor to select the pairs of first and second transistors that generate the same current. Such methods can then change the initial target voltage by a different incremental amount to change the initial target voltage to an altered target voltage (using the selected first transistors) in item 308. More specifically, these methods use the selected first transistors to increment the initial target voltage in equal voltage increments from the low voltage target to the high voltage target, when the first transistors change the initial target voltage to the altered target voltage.

Further, these methods remove the current generated by the first transistors (using corresponding ones of the second transistors) in item 310, thereby causing an opposite current, and leaving the initial target voltage unaffected. Again, each first transistor has a corresponding second transistor that produces the same current as the first transistor to which it corresponds. More specifically, the current generated by the first transistors is removed from a resistor of the differential voltage generator by the opposing current generated by the second transistors. Thus, in item 310, the second transistors generate an equal and opposite current through the resistor to prevent voltage changes caused by the first transistors from affecting the initial target voltage. These methods then output the altered target voltage from the first output, and output the initial target voltage from the second output, as shown in item 312.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

The flowchart and block diagrams in the figures illustrate the architecture, functionality, and operation of possible implementations of devices and methods according to various embodiments. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Each respective figure, in addition to illustrating methods of and functionality of the present embodiments at various stages, also illustrates the logic of the method as implemented, in whole or in part, by one or more devices and structures. Such devices and structures are configured to (i.e., include one or more components, such as resistors, capacitors, transistors and the like that are connected to enable the performing of a process) implement the method described above. In other words, one or more computer hardware devices can be created that are configured to implement the method and processes described herein with reference to the figures and their corresponding descriptions.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A differential voltage generator comprising:
a voltage input;
a first offset element and a second offset element connected to the voltage input;
a first output connected to the first offset element;
a second output connected to the second offset element and to the voltage input, wherein the voltage input is capable of receiving an initial target voltage and providing the initial target voltage to the first offset element and the second offset element, the first offset element includes first transistors, the second offset element includes second transistors, each of the first transistors is capable of changing the initial target voltage by a different incremental amount to change the initial target voltage to an altered target voltage, the second transistors are capable of removing a current generated by the first transistors thereby causing an opposite current and leaving the initial target voltage unaffected on the second output, each of the first transistors has a corresponding pair transistor in the second transistors that causes the same current flow, the first output is capable of outputting the altered target voltage, and the second output is capable of outputting the initial target voltage; and
a multiplexor connected to the first transistors and the second transistors, the multiplexor is capable of selecting, in response to selection signals, pairs of the first transistors and the second transistors that generate the same current.

2. The differential voltage generator according to claim 1, further comprising a resistor connected between the first offset element and the second offset element, wherein the current generated by the first transistors is removed from the resistor by the current generated by the second transistors.

3. The differential voltage generator according to claim 2, the first transistors and the second transistors generate an equal and opposite current through the resistor to prevent voltage changes caused by the first transistors from affecting the initial target voltage on the second output.

4. The differential voltage generator according to claim 1, further comprising:
a precision current source connected to the multiplexor, wherein the precision current source is capable of providing the selection signals to the multiplexor to select the pairs of the first transistors and the second transistors that generate the same current.

5. The differential voltage generator according to claim 1, wherein the first transistors increment the initial target voltage in equal voltage increments from a low voltage target to a high voltage target when the first transistors change the initial target voltage to the altered target voltage.

6. The differential voltage generator according to claim 1, further comprising a unity gain operational amplifier connected to the voltage input, the unity gain operational amplifier is capable of supplying the initial target voltage to the second output.

7. The differential voltage generator according to claim 1, wherein the first offset element comprises a digital-to-analog converter.

8. An integrated circuit device comprising:
electronic memory cells;
electronic lines connected to the electronic memory cells; and
a charging circuit connected to the electronic lines that is capable of charging the electronic lines,
the charging circuit comprises a differential voltage generator, and the differential voltage generator comprises:
a voltage input;
a first offset element connected to the voltage input;
a second offset element connected to the voltage input;
a multiplexor connected to the first offset element and the second offset element;
a first output connected to the first offset element; and
a second output connected to the second offset element and to the voltage input,
wherein the voltage input is capable of receiving an initial target voltage and providing the initial target voltage to the first offset element and the second offset element,
wherein the first offset element includes first transistors and the second offset element includes corresponding second transistors,
wherein the multiplexor is capable of selecting pairs of the first transistors and the second transistors that generate the same current in response to selection signals,
wherein each of the first transistors is capable of changing the initial target voltage by a different incremental amount to change the initial target voltage to an altered target voltage,
wherein a current is generated by the first transistors when the first transistors change the initial target voltage to the altered target voltage,
wherein the second transistors are capable of removing the current flow generated by the first transistors by generating opposite current to leave the initial target voltage unaffected on the second output,
wherein each of the first transistors has a corresponding pair transistor in the second transistors that causes the same current flow,
wherein the first output is capable of outputting the altered target voltage, and
wherein the second output is capable of outputting the initial target voltage.

9. The integrated circuit device according to claim 8, further comprising a resistor connected between the first offset element and the second offset element, wherein the current generated by the first transistors is removed from the resistor by the current generated by the second transistors.

10. The integrated circuit device according to claim 9, the pairs of the first transistors and the second transistors generate an equal and opposite current through the resistor to prevent voltage changes caused by the first transistors from affecting the initial target voltage on the second output.

11. The integrated circuit device according to claim 8, further comprising a precision current source connected to the multiplexor, wherein the precision current source is capable of providing the selection signals to the multiplexor to select the pairs of the first transistors and the second transistors that generate the same current.

12. The integrated circuit device according to claim 8, wherein the first transistors increment the initial target voltage in equal voltage increments from a low voltage target to a high voltage target when the first transistors change the initial target voltage to the altered target voltage.

13. The integrated circuit device according to claim 8, further comprising a unity gain operational amplifier connected to the voltage input, the unity gain operational amplifier is capable of supplying the initial target voltage to the second output.

14. The integrated circuit device according to claim 8, wherein the first offset element comprises a digital-to-analog converter.

15. A method comprising:
receiving, by a voltage input of a differential voltage generator, an initial target voltage;
providing the initial target voltage to a first offset element and a second offset element of the differential voltage generator, wherein the first offset element includes first transistors, the second offset element includes second transistors;
changing, by the first transistors, the initial target voltage by a different incremental amount to change the initial target voltage to an altered target voltage;
removing, by the second transistors, a current generated by the first transistors thereby causing an opposite current and leaving the initial target voltage unaffected, wherein each of the first transistors has a corresponding pair transistor in the second transistors that causes the same current flow;
outputting, by a first output of the differential voltage generator, the altered target voltage;
outputting, by a second output of the differential voltage generator, the initial target voltage; and
selecting, by a multiplexor of the differential voltage generator in response to selection signals, pairs of the first transistors and the second transistors that generate the same current.

16. The method according to claim 15, wherein the current generated by the first transistors is removed from a resistor of the differential voltage generator by the current generated by the second transistors.

17. The method according to claim 16, wherein the second transistors generate an equal and opposite current through the resistor to prevent voltage changes caused by the first transistors from affecting the initial target voltage.

18. The method according to claim 15, further comprising:
providing, by a precision current source of the differential voltage generator, the selection signals to the multiplexor to select the pairs of the first transistors and the second transistors that generate the same current.

19. The method according to claim 15, further comprising incrementing, by the first transistors the initial target voltage in equal voltage increments from a low voltage target to a high voltage target when the first transistors change the initial target voltage to the altered target voltage.

20. The method according to claim 15, further comprising supplying the initial target voltage to the second output using a unity gain operational amplifier connected to the voltage input.

* * * * *